United States Patent [19]
Sato et al.

[11] Patent Number: 5,600,118
[45] Date of Patent: Feb. 4, 1997

[54] BINARIZING CIRCUIT AND BAR-CODE READER USING SUCH

[75] Inventors: Shinichi Sato; Isao Iwaguchi; Ichiro Shinoda; Hiroaki Kawai, all of Kawasaki, Japan

[73] Assignee: Fujitsu Limited, Kawasaki, Japan

[21] Appl. No.: 452,696

[22] Filed: May 30, 1995

[30] Foreign Application Priority Data

Jul. 13, 1994 [JP] Japan .................................. 6-161513

[51] Int. Cl.⁶ .................................................. G06K 7/10
[52] U.S. Cl. ...................................... 235/462; 235/463
[58] Field of Search ..................................... 235/462, 463

[56] References Cited

U.S. PATENT DOCUMENTS 5,168,148  12/1992  Giebel ..................................... 235/462

FOREIGN PATENT DOCUMENTS 0036951  10/1981  European Pat. Off. .
1446512  8/1976  United Kingdom .
1468624  3/1977  United Kingdom .
1584434  2/1981  United Kingdom .
2246653  2/1992  United Kingdom .

Primary Examiner—Harold Pitts
Attorney, Agent, or Firm—Nikaido, Marmelstein, Murray & Oram LLP

[57] ABSTRACT

A binarizing circuit includes a binary signal generating unit for generating a binary signal from an input signal, supplied from an external unit, in accordance with a processing characteristic, a detecting unit for detecting a state of the input signal, and a control unit for controlling, based on the state of the input signal detected by the detecting unit, the processing characteristic in accordance with which the binary signal generating unit generates the binary signal from the input signal. The bar-code reader includes a reading unit for optically reading an article on which a bar code is formed, the above binarizing circuit, and a decoding unit for decoding the binary signal output from the binarizing circuit so that data represented by the bar code is obtained.

14 Claims, 19 Drawing Sheets

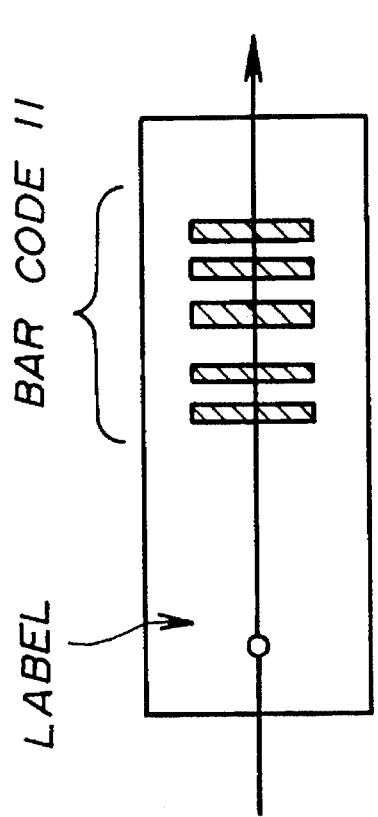
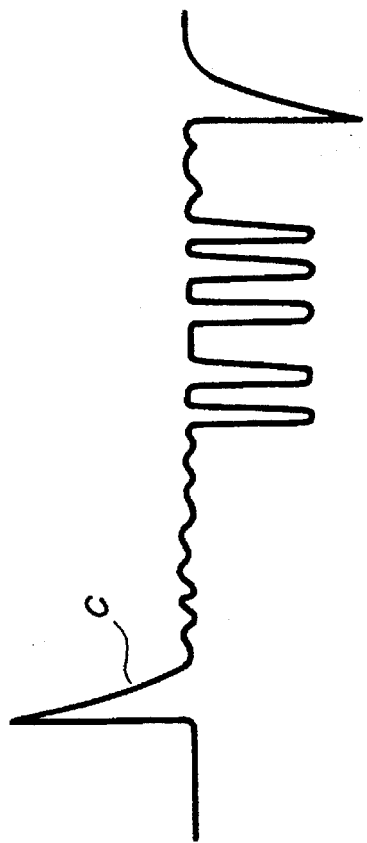
FIG.13A
FIG.13B
FIG.13C

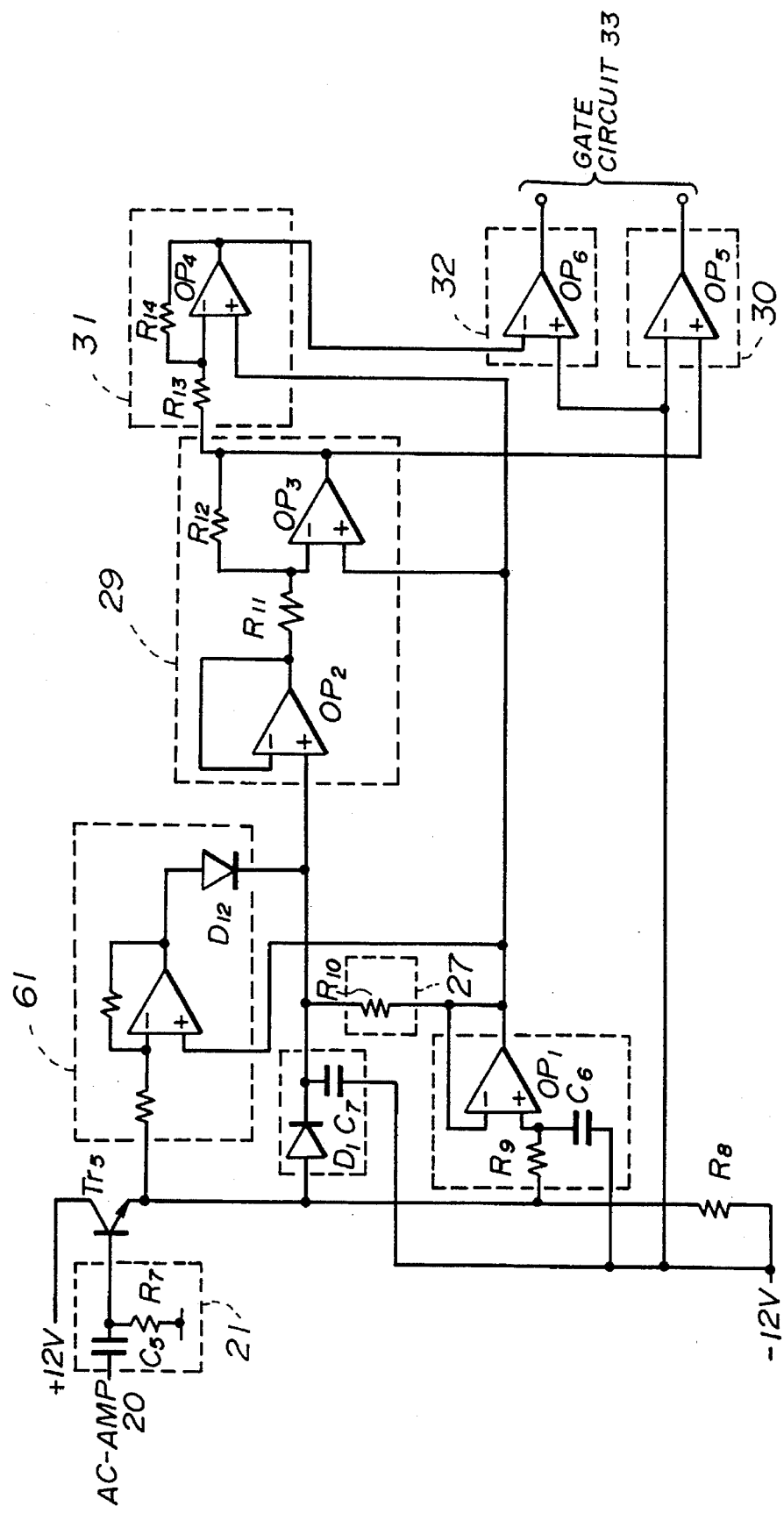

BINARIZING CIRCUIT AND BAR-CODE READER USING SUCH

BACKGROUND OF THE INVENTION (1) Field of the Invention

The present invention generally relates to a binarizing circuit and a bar-code reader using it, and more particularly to a binarizing circuit for generating binary signals which are used to decode analog signals including coded signals obtained by reading of bar codes, and a bar-code reader using the binarizing circuit.

(2) Description of the Related Art

To prevent an erroneous reading of bar codes, it is standardized that a bar code is placed between marginal areas. Each of the marginal areas is white in color and has a predetermined length (e.g., 7 modules).

In a bar-code reader, reflected light from a medium on which a bar code is formed is detected by a detector and a signal output from the detector is amplified. The amplified signal is then binarized and decoded in accordance with a bar-code recognition logic. If an accurate binarization for the bar code (and the marginal area) is not executed, the bar code is not accurately read.

In a bar-code reader using a laser unit as a light source, since a readable depth of the laser beam is large, the reflected light has a large dynamic range. In this case, when an area having a large reflectance, such as the marginal areas, is scanned by a laser beam having a small spot size, fine roughness of the area causes noise in the detected signals.

Conventionally, to prevent errors from occurring in the binarization of the marginal areas by the noises in the detected signals, detected signals having levels lower than a predetermined level are not binarized.

In addition, in a bar-code reader, bar-code signals are processed by amplifier circuits and signal processing circuits, all of which are AC-coupled so as to have a relatively narrow frequency band. Thus, all signals including the predetermined level (a lower limit) used to prevent errors from occurring in the binarization of the marginal area are processed using AC components of the amplitude.

Even if there is no reflected light, outputs of the amplifiers and differential signals are varied caused by electrical noises. To prevent these electrical noises from affecting binarizing signals corresponding to the outputs of the amplifiers and the differential signals and to prevent binarizing signals from being affected from the noises corresponding to the fine roughness of a sheet, a lower limit is needed for the bar-code reader.

An example of a structure of the bar-code reader is shown in FIG. 1.

Referring to FIG. 1, a bar-code reader 11 has an optical scanner unit 12, a converging unit 13, a detector 14, a binarizing circuit 15, a bar-width counter 16, a decoding unit 17, a checking unit 18 and a determination unit 19. The optical scanner 12 has a light source and an optical system and outputs a scanning light beam used to scan a bar code 11. The converging unit 13 makes a reflected light beam from the bar code 11 which is scanned by the scanning light beam converge upon the detector 14. The detector 14 has a photodiode and converts the light beam into an electric signal. The electric signal is an infinitesimal signal, so that the electric signal output from the detector 14 is amplified and then supplied to the binarizing circuit 15. The binarizing circuit 15 converts the signal from the detector 14 into a binary signal having two levels: a high level (a logical value "1") and a low level (a logical value "0"). The binary signal is formed of pulses each of which occurs at a timing corresponding to a boundary portion between a white area and a black area of the bar code 11. The bar-width counter 16 performs a counting operation to measure intervals between pulses of the binary signal. The respective intervals correspond to widths of white and black areas of the bar code 11. Thus, the bar-width counter 16 outputs a count value corresponding to each of the widths of the white and black areas of the bar code 11. The decoding unit 17 decodes counting values, corresponding to the white and black areas of the bar code 11, from the bar-width counter 16 so as to generate data corresponding to the bar code 11.

The checking unit 18 checks the structure of the bar code 11 based on the count values from the bar-width counter 16. The checking unit 18 has a start margin detecting unit 18a, a guard bar detecting unit 18b, a character detecting unit 18c and an end margin detecting unit 18d. The respective units 18a, 18b, 18c and 18d of the checking unit 18 check the count values from the bar-counter 16 and detect a start margin portion, guard bars, a character portion and an end margin portion in the bar code 11. The determination unit 19 has a sequence controller 19a and a data output unit 19b. The sequence controller 19a outputs a control signal for permitting to output the data when the start margin detecting unit 18a, the guard bar detecting unit 18b, the character detecting unit 18c and the end margin detecting unit 18d obtain normal results. The data output unit 19b controls, in accordance with the control signal from the sequence controller 19a, whether the data from the decoding unit 17 is output as effective decoded data.

The binarizing circuit 15 is formed as shown in FIG. 2. Referring to FIG. 2, the binarizing circuit 15 has an AC amplifier 20, a differentiating circuit 21, an integrating circuit 22, a comparator 23 and an undefined pulse removing circuit 24. The AC amplifier 20 performs an AC amplification of the signals from the detector 14. The differentiating circuit 21 differentiates the signal output from the AC amplifier 20 and produces a differential signal. The integrating circuit 22 integrates the differential signal so as to output an integral signal which is slightly delayed from the differential signal. The comparator 23 compares the differential signal from the differentiating circuit 21 and the integral signal from the integrating circuit 22. The comparator 23 outputs a pulse signal having a high level when the level of the integral signal is greater than the level of the differential signal. The undefined pulse removing circuit 24 removes pulses from the pulse signal output from the comparator 23 in undefined periods in which the state of the pulse signal is undefined caused by noises.

The undefined pulse removing circuit 24 has a DC component detecting circuit 25, a peak-hold circuit 26, a discharging circuit 27, a lower limiter 28, a dividing circuit 29, a comparator 30, an inverting circuit 31, a comparator 32 and a gate circuit 33. The DC component detecting circuit 25 detects a DC level of the differential signal from the differentiating circuit 21. The peak-hold circuit 26 holds a peak level of the differential signal. The peak level held by the peak-hold circuit 26 is discharged through the discharging circuit 27 until an output level of the discharging circuit 27 reaches the DC level detected by the DC component detecting circuit 25. The lower limiter circuit 28 controls the level of the output signal of the discharging circuit 27 so that the level is not less than a lower limit level. The dividing circuit 29 divides the level of the output signal of the discharging circuit 27 and adds the divided level to the DC level detected by the DC component detecting circuit 25.

The comparator 30 compares the level of the output signal of the dividing circuit 29 and the level of the differential signal from the differentiating circuit 21. The comparator 30 outputs a white gate pulse signal. The white gate pulse signal has a low level when the level of the differential signal is less than the level of the output signal of the dividing circuit 29. The inverting circuit 31 inverts the level of the output signal of the dividing circuit 29 about the DC level detected by the DC component detecting circuit 25. The comparator 32 compares the level of the output signal of the inverting circuit 31 and the differential signal from the differentiating circuit 21 and outputs a black gate signal. The black gate signal has a low level when the level of the differential signal is greater than the level of the output signal of the inverting circuit 31. The gate circuit 33 receives the pulse signal (a binary signal) from the comparator 23, the white gate signal from the comparator 30 and the black gate signal from the comparator 32. When either the white gate pulse signal or the black gate pulse signal has a high level, the pulse signal from the comparator 23 passes through the gate circuit 33. When neither the white gate pulse signal nor the black gate pulse signal has the high level, the gate circuit 33 inhibits the pulse signal from the comparator 23 from passing through the gate circuit 33 so that the output signal of the gate circuit 33 is maintained, for example, at a low level.

A description will now be given of operations of the binarizing circuit 15.

When the scanning beam scans a label on which the bar code 11 is formed as shown in FIG. 3A, the detector 14 outputs the signal as shown in FIG. 3B. The signal output from the detector 14 has a high level corresponding to the reflected light on each white area having a high reflectance and a low level corresponding to the reflected light on each black area having a low reflectance. The intensity of the reflected light in the marginal areas S1 and S2 (white areas) is varied caused by the roughness there of and dirt on the surface. As a result, the signal output from the detector 14 has noises N1 and N2 corresponding to the variation of the reflected light in the marginal areas S1 and S2.

The signal output from the detector 14 as shown in FIG. 3B is AC-amplified by the AC amplifier 20 of the binarizing circuit 15, so that the AC amplifier 20 outputs a signal as shown in FIG. 3C. The signal output from the AC amplifier 20 is differentiated by the differentiating circuit 21, so that a differential signal (1) as shown in FIG. 3D is obtained. The differential signal (1) is supplied to the integrating circuit 22 and the undefined pulse removing circuit 24. When the differential signal (1) is integrated by the integrating circuit 22, the integrating circuit 22 outputs an integral signal (2) which is slightly delayed from the differential signal (1), as shown in FIG. 3E(a). The comparator 23 outputs a binary signal based on the comparison result of the differential signal (1) and the integral signal (2). When the differential signal (1) is less than the integral signal (2), the binary signal has the high level, and when the differential signal (1) is greater than the integral signal (2), the binary signal has the low level, as shown in FIG. 3E(b).

The binary signal output from the comparator 23 includes noise pulses which are obtained by the binarization of the noises N1 and N2 as shown in FIG. 3H. The undefined pulse removing circuit 24 removes the noise pulses from the binary signal output from the comparator 23. In the undefined pulse removing circuit 24, a peak level of the differential signal (1) is held by the peak-hold circuit 26. The peak level held by the peak-hold circuit 26 is then discharged by the discharging circuit 27 so that the output level of the discharging circuit 27 is gradually decreased. The output level of the discharging circuit 27 is divided by the dividing circuit 29, so that the dividing circuit 29 outputs a first slicing level (3) which is gradually decreased from half of the peak level of the differential signal (1), as shown in FIG. 3D. Further, the first slicing level (3) is inverted by the inverting circuit 31, so that the inverting circuit 31 outputs a second slicing level (3') as shown in FIG. 3D.

The output level of the discharging circuit 27 is controlled by the lower limiter 28 so that the output level is not less than a predetermined level. As a result, absolute values of the first slicing level (3) and the second slicing level (3') are controlled so as to be not less than the lower limit level. The lower limit level is set at a level which is slightly greater than levels of noises normally included in the differential signal (1) as shown in FIG. 3D The comparator 30 compares the differential signal (1) and the first slicing level (3) and outputs the white gate pulse signal based on the comparison result. When the differential signal (1) is greater than the first slicing level (3), the white gate pulse has the high level, and when the differential signal (1) is less than the first slicing level (3), the white gate pulse has the low level, as shown in FIG. 3F. The comparator 32 compares the differential signal (1) and the second slicing level (3') and outputs the black gate pulse signal based on the comparison result. When the differential signal (1) is less than the second slicing level (3'), the black gate pulse signal has the high level, and when the differential signal (1) is greater than the second slicing level (3'), the black gate pulse signal has the low level, as shown in FIG. 3G. Since the lower limit level is greater than levels of noises normally included in the differential signal (1), the white gate pulse signal and the black gate pulse signal do not include noise pulses as shown in FIGS. 3F and 3G.

The gate circuit 33 includes logic gates such as AND gates. When the white gate pulse signal or the black gate pulse signal has the high level, the binary signal from the comparator 23 passes through the gate circuit 33. As a result, noise pulses included in the binary signal as shown in FIG. 3H are removed therefrom, so that the binary signal as shown in FIG. 3I is output from the gate circuit 33.

In the bar-code reader using the binarizing circuit 15 as described above, when an article on which a bar code 11 is formed is located far away from a reading window, the scanning beam is not focused on the surface of the article. In this case, the scanning beam has a large spot size BM1 on the surface of the article as shown in FIG. 4A so that the DC-level L1 of the detected signal is reduced as shown in FIG. 4B. When the DC-level of the detected signal is less than or equal to a predetermined level, peak levels of the differential signal corresponding to the bar code 11 are less than the slicing level which is limited to the lower limit level, as shown in FIG. 4C, so that the differential signal is not accurately binarized. In this case, to prevent the peak levels of the differential signal from being less than the slicing level, the lower limit level may be lowered.

On the other hand, when the scanning beam is focused on the surface of an article so as to have a small spot size BM2 on the surface of the article as shown in FIG. 5A, the DC-level L2 of the detected signal is increased as shown in FIG. 5B. In this case, noise levels caused by the roughness of marginal areas N1 and N2 (white in color) are large. If the lower limit level is lowered as in the above case, some of the noise levels may exceed the slicing level as shown in FIG.

3D (at a time to), so that the bar code 11 cannot be accurately read.

In addition, since the detected signal is AC-amplified, the waveform of the AC-amplified signal is deteriorated in a low frequency band in accordance with the frequency characteristic of the AC-amplifier. As a result, the slicing level is varied so that noises are binarized.

SUMMARY OF THE INVENTION

Accordingly, a general object of the present invention is to provide a novel and useful binarizing circuit in which the disadvantages of the aforementioned prior art are eliminated and to provide a bar-code reader using the binarizing circuit.

A specific object of the present invention is to provide a binarizing circuit which can accurately generate binary signals from input signals even if the levels of the input signals are varied.

The above objects of the present invention are achieved by a binarizing circuit comprising: binary signal generating means for generating a binary signal from an input signal, supplied from an external unit, in accordance with a processing characteristic; detecting means for detecting a state of the input signal; and control means for controlling, based on the state of the input signal detected by the detecting means, the processing characteristic in accordance with which the binary signal generating means generates the binary signal from the input signal.

According to the present invention, since the processing characteristic in accordance with which the binary signal generating means generates the binary signal is controlled based on the state of the input signal, the binary signals can be accurately generated from the input signals even if the levels of the input signals are varied.

Another object of the present invention is to provide a bar-code reader using the binarizing circuit described above.

The object of the present invention is achieved by a bar-code reader comprising: reading means for optically reading an article on which a bar code is formed, the reading means outputting a detected signal corresponding to a reading result of the article; a binarizing circuit for inputting the detected signal and outputting a binary signal corresponding to the detected signal; and decoding means for decoding the binary signal so that data represented by the bar code is obtained, wherein the binary circuit comprises: binary signal generating means for generating a binary signal from the detected signal, supplied from the reading means, in accordance with a processing characteristic; detecting means for detecting a state of the detected signal; and control means for controlling, based on the state of the detected signal detected by the detecting means, the processing characteristic in accordance with which the binary signal generating means generates the binary signal from the detected signal.

According to the present invention, a bar-code reader using the binarizing circuit described above can accurately read the bar code formed on the article.

BRIEF DESCRIPTION OF THE DRAWINGS

Other objects, features and advantages of the present invention will be apparent from the following detailed description when read in conjunction with the accompanying drawings, in which:

FIG. 13A is a diagram illustrating a label on which a bar code is formed;

FIG. 13B is a waveform diagram illustrating a detected signal obtained when a scanning beam scans the label shown in FIG. 13A;

FIG. 13C is a waveform diagram illustrating a signal obtained by AC-amplifying the detected signal shown in FIG. 13B;

FIG. 18 is a detailed circuit diagram illustrating a part of the binarizing circuit shown in FIG. 17;

DESCRIPTION OF THE PREFERRED EMBODIMENTS

A description will now be given of embodiments of the present invention.

Figure 6:
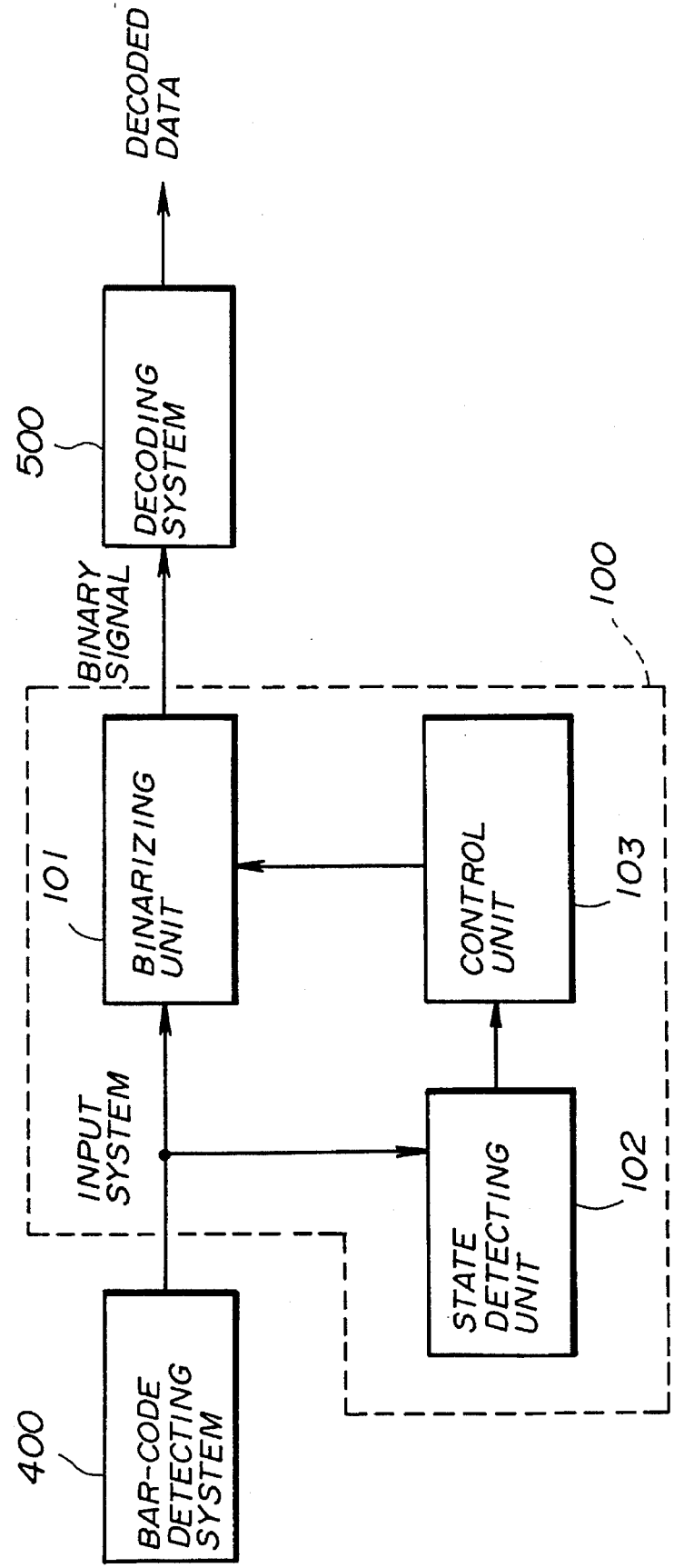
FIG. 6 is a block diagram illustrating a structure of a binarizing circuit according to the present invention.

A fundamental structure of a bar-code reader having a binarizing circuit is formed as shown in FIG. 6. Referring to FIG. 6, a bar-code reader has a bar-code detecting system 400, a binarizing circuit 100 and a decoding system 500. The bar-code detecting system 400 optically scans a bar code and outputs a detected signal corresponding to the bar code. The binarizing circuit 100 has a binarizing unit 101, a state detecting unit 102 and a control unit 103. The detected signal output from the bar-code detecting system 400 is supplied, as an input signal, to the binarizing unit 101. The binarizing unit 101 converts the input signal into a binary signal in accordance with a processing characteristic (e.g. a slicing level). The state detecting unit 102 detects a state (e.g., a DClevel) of the input signal. The control unit 103 controls the processing characteristic of the binarizing unit 101 in accordance with the state detected by the state detecting unit 102. The decoding unit 500 decodes the binary signal supplied from the binarizing circuit 100 and outputs decoded data corresponding to the bar code.

According to the binarizing circuit 100 described above, the processing characteristic in accordance with which the input signal is converted into the binary signal depends on the state (e.g., the DClevel) of the input signal. Thus, even if the state of the input signal is varied, the input signal can be converted into the binary signal in accordance with a processing characteristic suitable for the input signal. As a result, the bar code can be accurately read.

Figure 7:
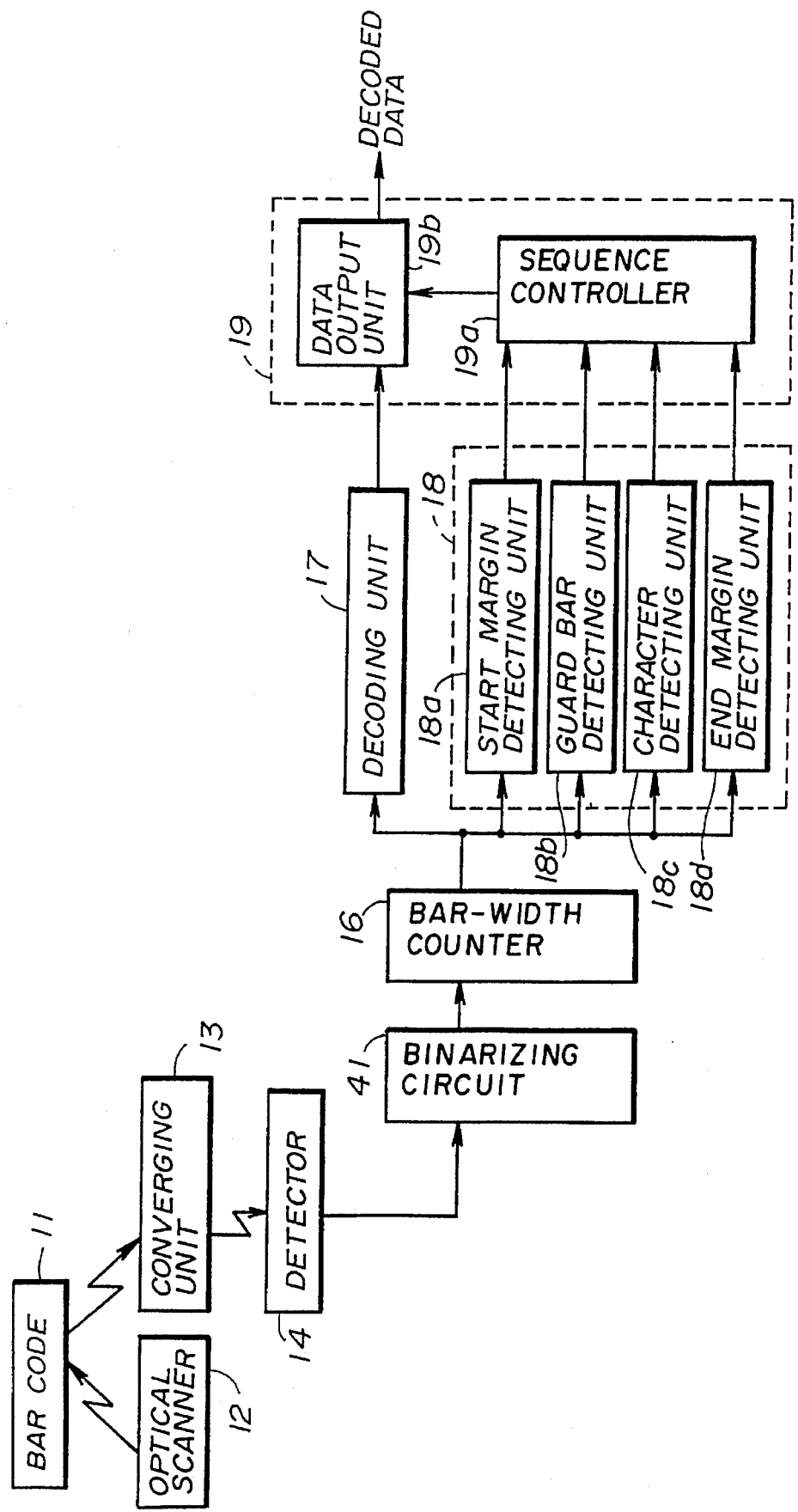
FIG. 7 is a block diagram illustrating a bar-code reader having the binarizing circuit according to the present invention.

A concrete structure of the bar-code reader is shown in FIG. 7. In FIG. 7, those parts which are the same as those shown in FIG. 1 are given the same reference numbers.

Figure 1:
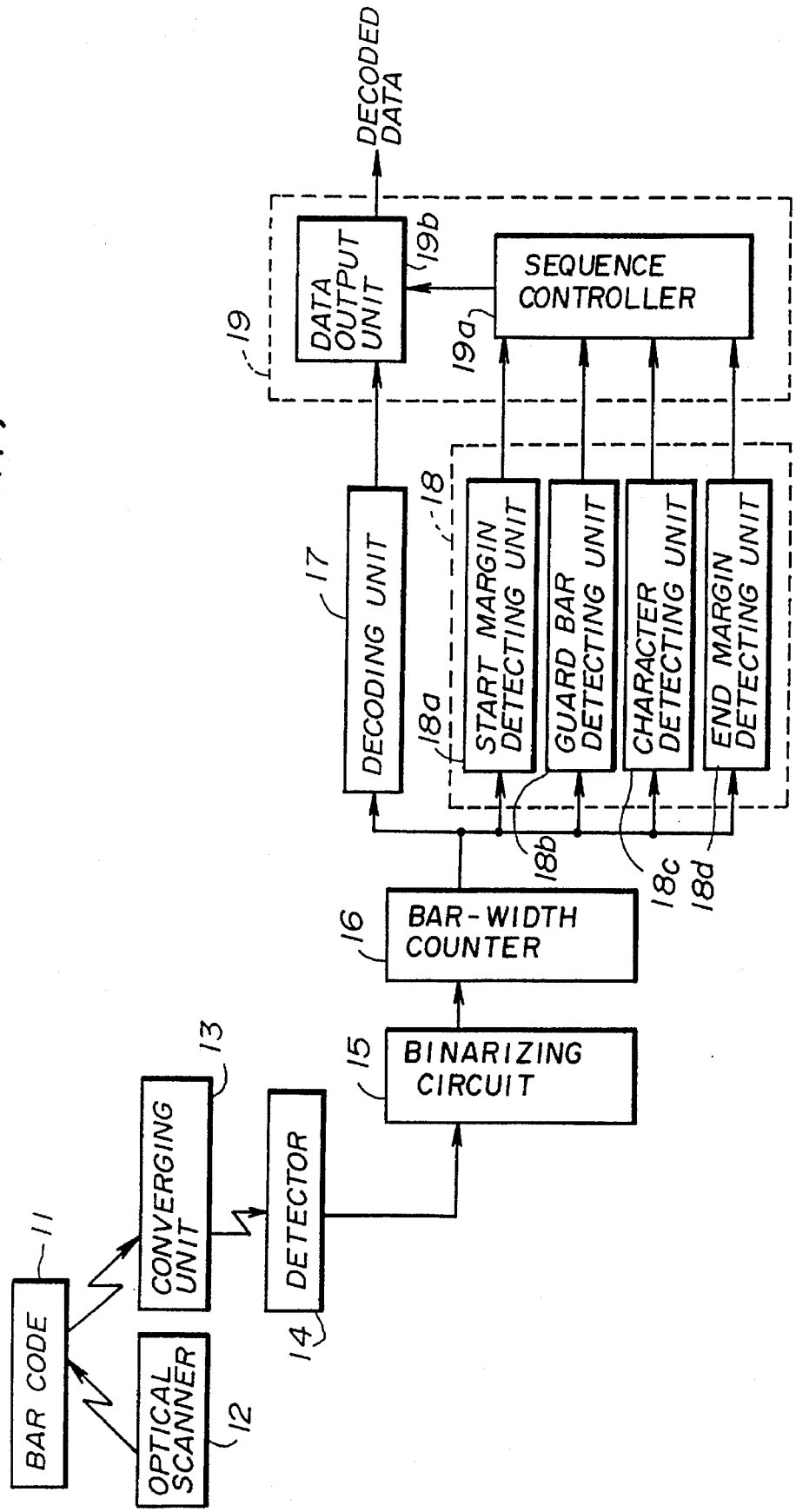
FIG. 1 is a block diagram illustrating a bar-code reader having a conventional binarizing circuit.

Referring to FIG. 7, the bar code reader has the optical scanner unit 12, the converging unit 13, the detector 14, a binarizing circuit 41, the bar-width counter 16, the decoding unit 17, the checking unit 18 and the determination unit 19 in the same manner as that show in FIG. 1. The structure of the binarizing circuit 41 differs from that of the conventional binarizing circuit 15 shown in FIG. 1.

The detected signal output from the detector 14 is converted into a binary signal by the binarizing circuit 41. The bar-width counter 16 outputs a count value corresponding to the width of each of black and white areas of the bar code. The decoding unit 17 decodes the count values from the bar-width counter 16 and outputs decoded data. The count values are supplied from the bar-width counter 16 also to the checking unit 18.

The checking unit 18 has the start margin detecting unit 18a, the guard bar detecting unit 18b, the character detecting unit 18c and the end margin detecting unit 18d. The start margin detecting unit 18a detects a start margin which is a white area adjacent to a leading end of a bar code. The start margin has a predetermined width greater than or equal to seven modules (a module representing a unit of width of each bar in a bar code). When a count value supplied from the bar-width counter 16 is a predetermined value corresponds to a width greater than or equal to seven modules, the start margin detecting unit 18a detects the start margin. The end margin detecting unit 18d detects an end margin which is a white area adjacent to a tail end of the bar code. The end margin has a predetermined width (greater than seven modules). When a count value corresponding to the width of the end margin is supplied to the end margin detecting unit 18d, the end margin detecting unit 18d detects the end margin.

The guard bar detecting unit 18b detects guard bars which are provided at the leading end of the bar code, in the bar code and at the tail end of the bar code, and which respectively represent a start of the bar code, separations of the bar code and the end of the bar code. When a count value corresponding to a width of a guard bar is supplied from the bar-width counter 16 to the guard bar detecting unit 18b, the guard bar detecting unit 18b detects the guard bar.

The character detecting unit 18c detects a period for characters. The character detecting unit 18c detects, as a period for characters, a period from receiving count values corresponding to the widths of the start margin and guard bar to receiving a count value corresponding to the width of the next guard bar. Further, the character detecting unit 18c also detects, as a period for characters, a period from receiving a count value corresponding to the width of a guard bar to receiving count values corresponding to the widths of the next guard bar and the end margin.

Detecting results obtained in the start margin detecting unit 18a, the guard bar detecting unit 18b, character detecting unit 18c and the end margin detecting unit 18d are supplied to the sequence controller 19a of the determination unit 19. The sequence controller 19a outputs control signals based on the detecting results from the checking unit 18. The data output unit 19b controls, in accordance with the control signals from the sequence controller 19a, whether the data from the decoding unit 17 is output as effective decoded data.

Figure 8:
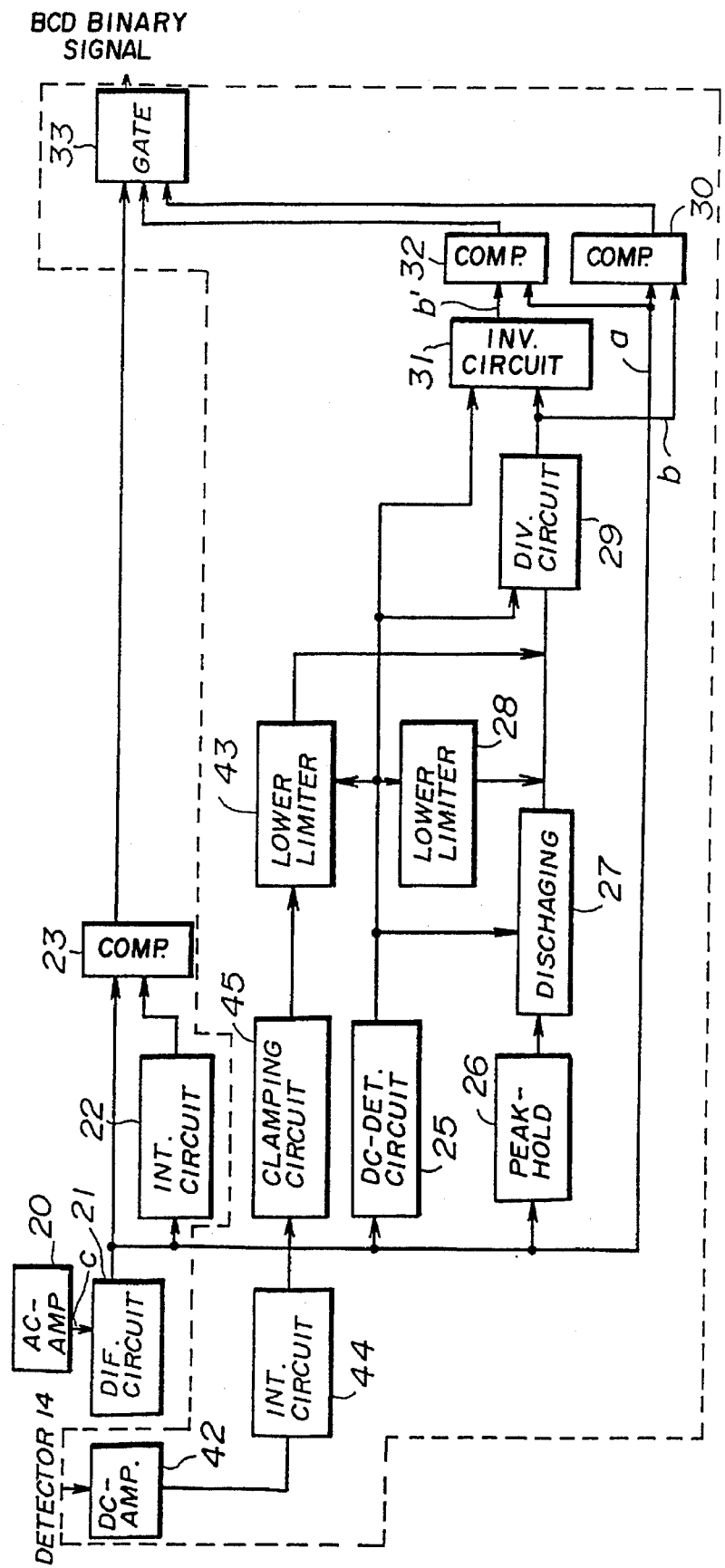
FIG. 8 is a block diagram illustrating a binarizing circuit according to a first embodiment of the present invention.

The binarizing circuit 41 is formed as shown in FIG. 8. In FIG. 8, those parts which are the same as those shown in FIG. 2 are given the same reference numbers.

Referring to FIG. 8, the binarizing circuit 41 has the ACamplifier 20, the differentiating circuit 21, the integrating circuit 22, the comparator 23 and the undefined pulse removing circuit 24. The undefined pulse removing circuit 24 has the DC component detecting circuit 25, peak-hold circuit 26, the discharging circuit 27, the first lower limiter 28, the dividing circuit 29, the comparators 30 and 32, the inverting circuit 31 and the gate circuit 33 in the same manner as that shown in FIG. 2. The undefined pulse removing circuit 24 further has a DCamplifier 42, a second lower limiter 43, an integrating circuit 44 and a clamping circuit 45.

The DCamplifier 42 amplifies the detected signal output from the detector 14. The integrating circuit 44 removes high-frequency components from the signal output from the DCamplifier 42. The clamping circuit 45 controls the level of the signal output from the integrating circuit 44 so that the highest level of the signal is limited to a predetermined level. The second lower limiter 43 outputs a second lower limit level controlled in accordance with the level of the signal from the clamping circuit 45. The second lower limit level from the second lower limiter 43 is applied to the output of the discharging circuit 27. Further, the first lower limit level (a fixed level) from the first lower limiter is applied to the output of the discharging circuit 27. As a result, when the second lower limit level is less than the first lower limit level, the lowest level of the output of the discharging circuit 27 is limited to the first lower limit level. When the second lower limit level is greater than the first lower limit level, the lowest level of the output of the discharging circuit 27 is limited to the second lower limit level.

Figure 2:
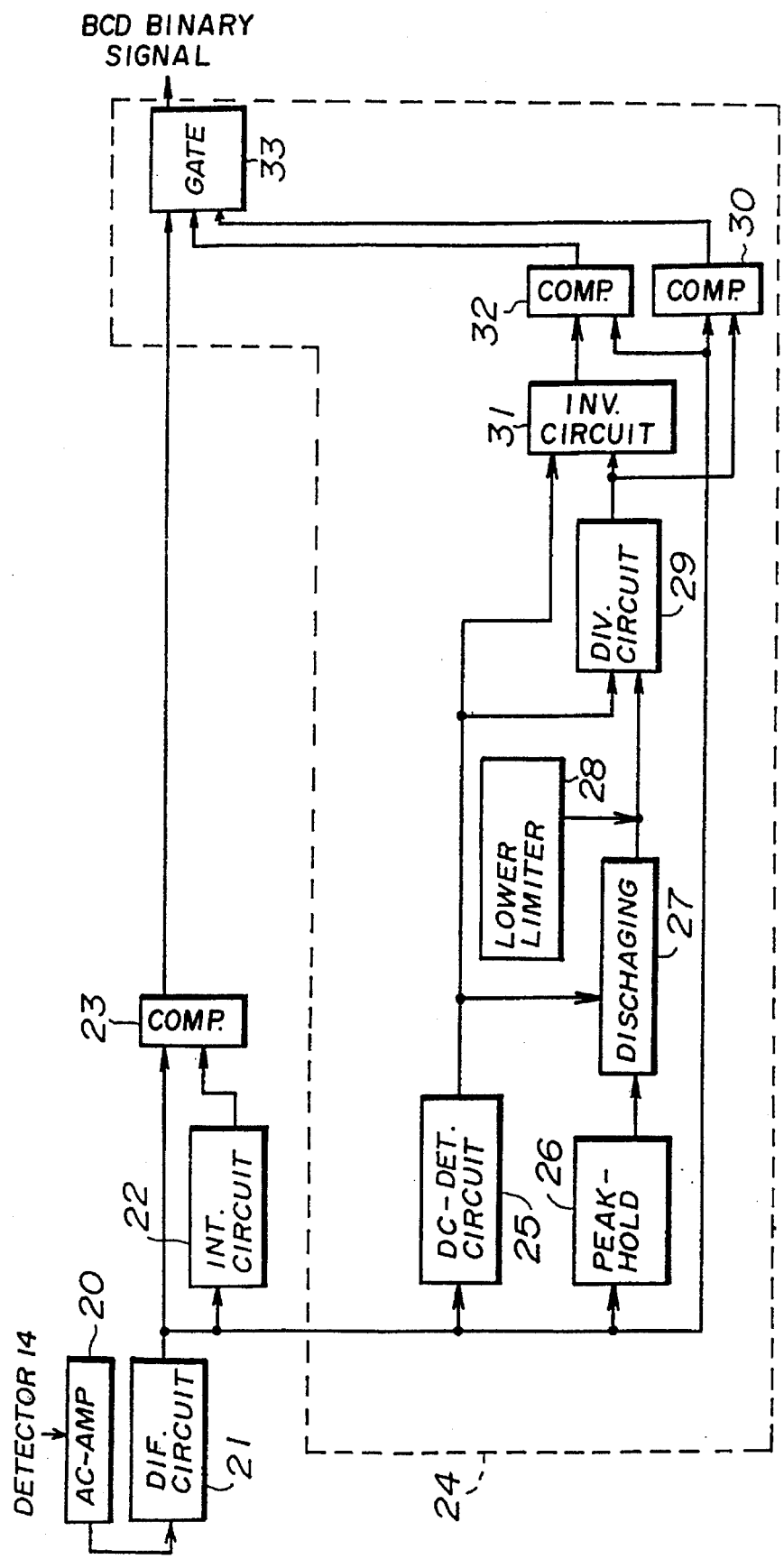
FIG. 2 is a block diagram illustrating the conventional binarizing circuit.
Figure 3A:
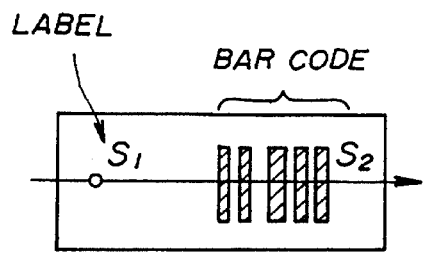
FIG. 3A is a diagram illustrating a label on which a bar code is formed.
Figure 3B:
FIG. 3B is a waveform diagram illustrating a detected signal obtained by scanning the surface of the label shown in FIG. 3A.
Figure 3C:
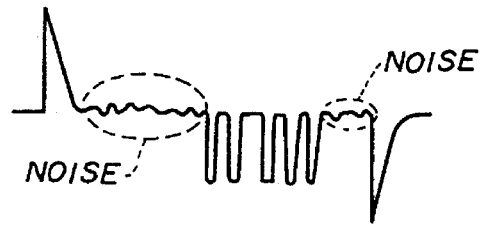
FIG. 3C is a waveform diagram illustrating a signal obtained by AC-amplifying the detected signal shown in FIG. 3B.
Figure 3D:
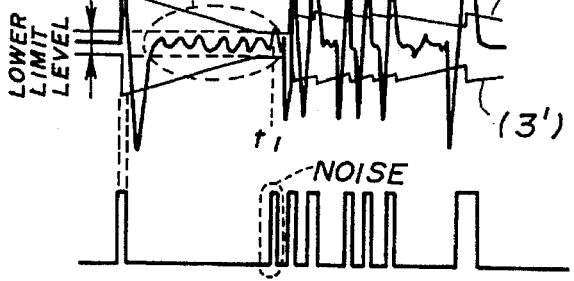
FIG. 3D is a waveform diagram illustrating a differential signal obtained by differentiating the signal shown in FIG. 3C.
Figure 3E:
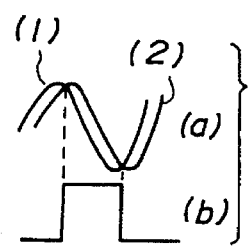
FIG. 3E (a) and (b) are waveform diagrams illustrating a phase difference between the differential signal and a signal obtained by integrating the differential signal and a binary signal generated based on the phase difference.
Figure 3F:
FIG. 3F is a waveform diagram illustrating a white gate pulse signal.
Figure 3G:
FIG. 3G is a waveform diagram illustrating a black gate pulse signal.
Figure 3H:
FIG. 3H is a waveform diagram illustrating a signal output from the comparator 23 in the binarizing circuit shown in FIG. 2.
Figure 3I:
FIG. 3I is a waveform diagram illustrating a binary signal obtained by the binarizing circuit.
Figure 4A:
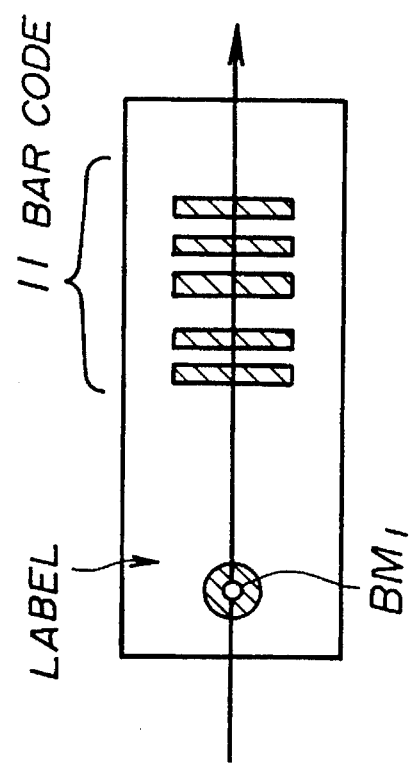
FIG. 4A is a diagram illustrating a label on which a bar code is formed and a scanning beam which is not focused on the surface of the label.
Figure 4B:
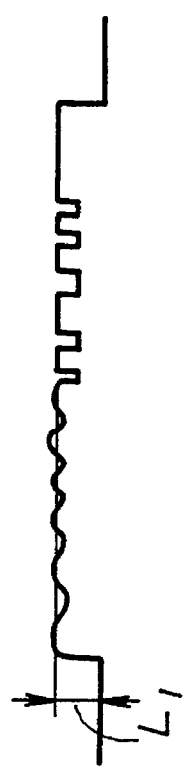
FIGS. 4B and 4C are waveform diagrams illustrating signals generated in the binarizing circuit when the scanning beam scans the surface of the label shown in FIG. 4A.
Figure 4C:
Figures 5A, 5B:
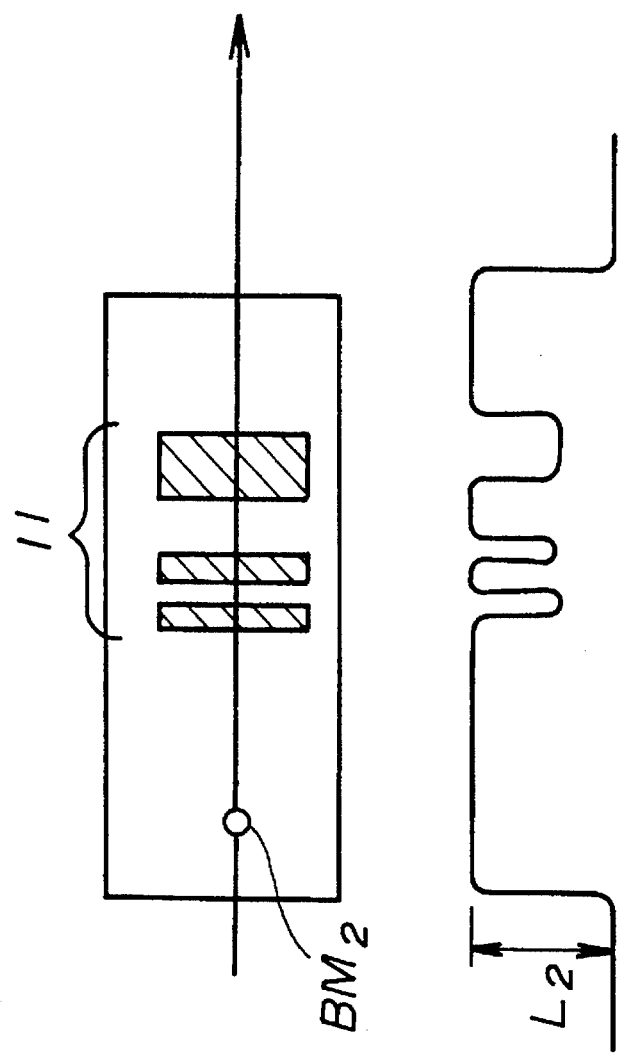
FIG. 5A is a diagram illustrating a label on which a bar code is formed and a scanning beam which is focused on the surface of the label.
FIG. 5B is a waveform diagram illustrating the detected signal generated in the binarizing circuit when the scanning beam scans the surface of the label shown in FIG. 5A.

The first slicing level (b) is generated by the dividing circuit 29, and the second slicing level (b') is generated by inverting the first slicing level (b) in the same manner as in the case shown in FIG. 2. The differential signal from the differentiating circuit 21 is compared with the first and second slicing levels (b) and (b') by the comparators 30 and 32 respectively, and the comparators 30 and 32 output the white gate pulse signal and the black gate pulse signal in the same manner as in the case shown in FIG. 2. The gate circuit 33 controls the signal from the comparator 23 based on the white and the black gate pulse signals and outputs a binary signal.

Figure 9:
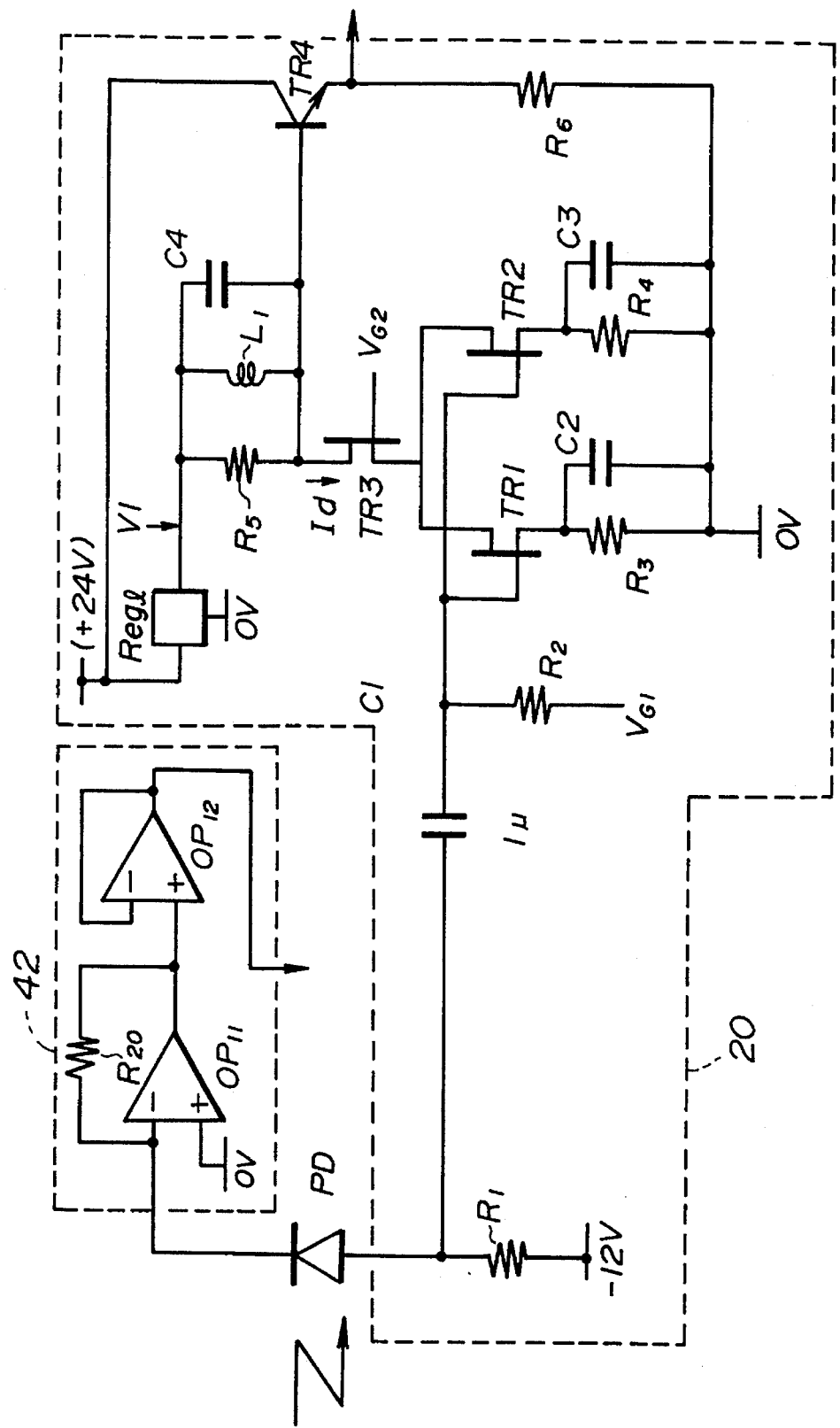
FIG. 9 is a circuit diagram illustrating a detailed structure of a DCamplifier and an ACamplifier included in the binarizing circuit shown in FIG. 8.

The ACamplifier 20 and the DCamplifier 42 are formed as shown in FIG. 9.

Referring to FIG.9, the ACamplifier 20 has resisters R1–R6, capacitors C1–C4, transistors TR1–TR4, an inductor L1 and a regulator Reg1. The resistor R1 is used as a signal input resistor and is connected between the anode of a photodiode PD in the detector 14 and a negative power line (e.g. −12 volts). A connection point at which the photodiode and the resister R1 are connected is coupled to the gates of the transistors TR1 and TR2 via the AC-coupling capacitor C1. The gates of the transistors TR1 and TR2 are applied with a bias voltage $V_{G1}$ via the resistor R2.

The capacitor C2 (a by-pass capacitor) and the resistor R3 are connected, in parallel, between the source of the transistor TR1 and the ground line (e.g. 0 volts). The capacitor C3 (a by-pass capacitor) and the resistor R4 are connected, in parallel, between the source of the transistor TR2 and the ground line. The drains of both the transistors TR1 and TR2 are connected to the source of the transistor TR3. The gate of the transistor TR3 is applied with a bias voltage $V_{G2}$. Since the transistors TR1 and TR2 are connected in parallel, the ACamplifier 20 is formed as a low-noise type amplifier. The transistors TR1 and TR2 are connected to the transistor TR3 in the so-called cascaded connection, so that the frequency characteristic can be improved and the gate leakage current can be reduced.

The drain of the transistor TR3 is connected with a resonance circuit having the resistor R5, the inductor L1 and the capacitor C4. The resonance circuit is supplied with a constant voltage V1 generated by the regulator Reg1 which is connected to a power line (e.g. 24 volts). The frequency characteristic of the ACamplifier 20 depends on values of the resistor R5, the inductor L1 and the capacitor C4 in the resonance circuit. A point at which the transistor TR3 and the resonance circuit are connected is connected to the base of the transistor TR4 having the collector connected to the power line (e.g. 24 volts) and the emitter coupled to the ground line via the output resistor R6.

Reflected light from the bar code projects onto the photodiode PD, so that the resistance of the photodiode is varied. The larger the amount of light projecting onto the photodiode PD, the smaller the resistance. Due to the variation of the resistance of the photodiode PD, the amount of current flowing through the resistor R1 is varied. As a result, the voltage at a connecting point at which the photodiode PD and the resistor R1 is connected is varied. Gate voltages of the transistors TR1 and TR2 are varied in accordance with the variation of the voltage at the connecting point of the photodiode and the resistor R1, so that drain currents of the transistors TR1 and TR2 are varied. Due to the variation of the drain currents of the transistors TR1 and TR2, a drain current of the transistor TR3 is varied. At this time, a base voltage of the transistor TR4 is varied, so that a current flowing through the transistor TR4 and the resistor R6 is varied. As a result, an amplified signal having a level corresponding to the amount of light projecting onto the photodiode PD is output from an output terminal of the ACamplifier 20.

The DCamplifier 42 has operational amplifiers $OP_{11}$ and $OP_{12}$ and a resistor $R_{20}$. The operational amplifier $OP_{11}$ and the resistor $R_{20}$ are connected so that an inverting amplifier circuit is formed. An output of the operational amplifier $OP_{12}$ is fed back to an inverting input terminal of the operational amplifier $OP_{12}$ so that a buffer is formed. The signal output from the photodiode PD is amplified by the DCamplifier 42 having the above structure.

Figure 10:
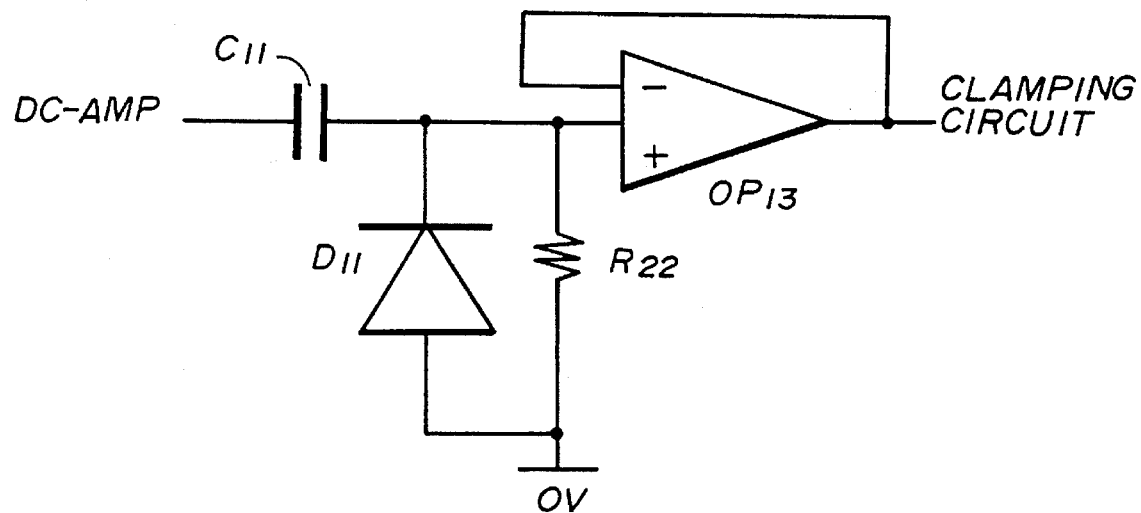
FIG. 10 is a circuit diagram illustrating an integrating circuit included in the binarizing circuit shown in FIG. 8.

The integrating circuit 44 is formed as shown in FIG. 10.

Referring to FIG. 10, the integrating circuit 44 has a capacitor $C_{11}$, a resistor $R_{22}$, a diode $D_{11}$ and an operational amplifier $OP_{13}$. The capacitor $C_{11}$ and the resistor $R_{22}$ form an essential part of the integrating circuit 44 so that an input signal is integrated by a circuit formed of the capacitor $C_{11}$ and the resistor $R_{22}$. The integrated signal in which the lowest level thereof is clamped by the diode $D_{11}$ is output via the operational amplifier $OP_{13}$ to the clamping circuit 45. The integrating circuit 44 removes high-frequency components from the signal supplied from the DCamplifier 42, so that the DClevel is prevented from rapidly being varied by noises.

Figure 11:
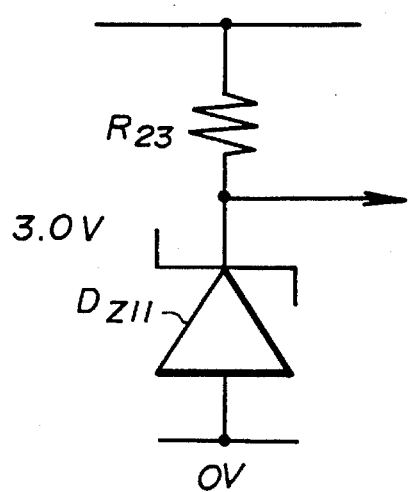
FIG. 11 is a circuit diagram illustrating a clamping circuit included in the binarizing circuit shown in FIG. 8.

The clamping circuit 45 is formed as shown in FIG. 11.

Referring to FIG. 11, the clamping circuit 45 has a resistor $R_{23}$ and a Zener diode $D_{z11}$. The signal output from the integrating circuit 44 is supplied to the cathode of the Zener diode $D_{z11}$ via the resistor $R_{23}$. The anode of the Zener diode $D_{z11}$ is connected to the ground line. The Zener diode $D_{z11}$ is saturated at a predetermined voltage (e.g. 3 volts) so that a voltage between both terminals of the Zener diode $D_{z11}$ does not exceed the predetermined voltage. As a result, even if the level of the signal supplied from the integrating circuit 44 is greater than the predetermined voltage (e.g. 3 volts), the output level of the clamping circuit 45 does not exceed the predetermined voltage. That is, the clamping circuit 45 outputs the signal in which the highest level thereof is limited to the predetermined level.

Since the highest level of the signal supplied from the clamping circuit 45 to the second lower limiter 43 is limited to the predetermined level, the second lower limit level is not freely increased in accordance with increasing of the DC-level of the detected signal. That is, the absolute value of each of the first and second slicing levels (b) and (b') is not freely increased in accordance with the increasing of the DC-level of the detected signal.

Figure 12:
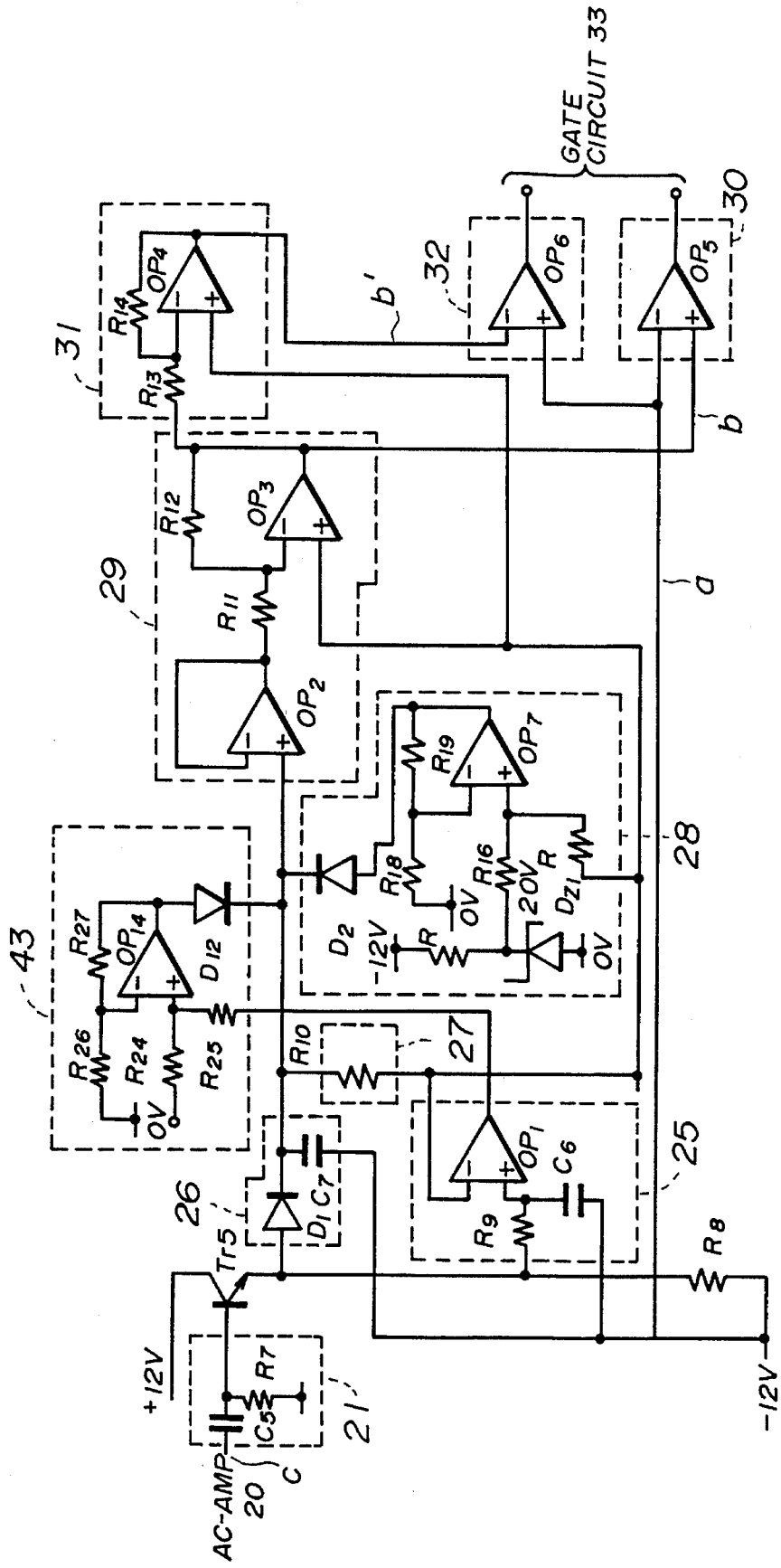
FIG. 12 is a detailed circuit diagram illustrating a part of the binarizing circuit shown in FIG. 8.

The differentiating circuit 21, the DC component detecting circuit 25, the peak-hold circuit 26, the discharging circuit 27, the first lower limiter 28, the dividing circuit 29, the comparators 30 and 32, the inverting circuit 31, the gate circuit 33 and the second lower limiter 43 are formed as shown in FIG. 12.

Referring to FIG. 12, the differentiating circuit 21 is formed of a capacitor C5 and a resistor R7 and differentiates the signal from the ACamplifier 20. The signal output from the differentiating circuit 21 is supplied to the integrating circuit 22. The signal output from the differentiating circuit 21 is also supplied to the DC component detecting circuit 25 and the peak-hold circuit 26 via an input circuit formed of a transistor TR5 and a resistor R8.

The DC component detecting circuit 25 is formed of an operational amplifier $OP_1$, a resistor R9 and a capacitor C6. The signal supplied from the differentiating circuit 21 is smoothed by a smoothing circuit formed of the resistor R9 and the capacitor C6. The DC-level obtained by the smoothing process is output through the operational amplifier $OP_1$ functioning as a buffer.

The peak-hold circuit 26 is formed of a diode D1 for reverse-current prevention and a capacitor C7 for holding a peak level. The capacitor C7 is charged by the signal supplied from the differentiating circuit 21 via the diode D1 so that a peak level of the signal is held by the capacitor C7.

The peak-hold circuit 26 is coupled to the DC component detecting circuit 25 via a resistor R10 functioning as the discharging circuit 27. After a peak level is held by the peak-hold circuit 26, the capacitor C7 of the peak-hold circuit 26 is discharged by the discharging circuit 27. As a result, the output level of the peak-hold circuit 26 is decreased toward the DC-level detected by the DC component detecting circuit 25 until the next peak level is held by the peak-hold circuit 26.

The dividing circuit 29 is formed of operational amplifies $OP_2$, $OP_3$ and resistors R11 and R12. The operational amplifier $OP_2$ functions as a buffer. The operational amplifier $OP_3$ and resistors R11 and R12 form an inverting amplifier circuit having a gain of ½. That is, the output signal of the dividing circuit 29 has a level which is half as large as a level of the signal from the discharging circuit 27. This gain of the inverting amplifier circuit is decided on the assumption that the noise level is less a level being half as large as the level of the differential signal. A non-inverting terminal of the operational amplifier $OP_3$ is provided with the DClevel from the DC component detecting circuit 25 so that the non-inverting terminal is fixed at the DClevel of the differential signal.

The output signal of the dividing circuit 29 having the first slicing level (b) is supplied to the inverting circuit 31 and a noninverting terminal of an operational amplifier $OP_5$ which functions as the comparator 30. The inverting circuit 31 is formed of resistors R13 and R14 and an operational amplifier $OP_4$. The resistors R13 and R14 have the same resistance value (R13=R14) so that an inverting amplifier having a gain of "1" is formed. A noninverting terminal of the operational amplifier $OP_4$ is provided with the DClevel detected by the DC component detecting circuit 25 so that the noninverting terminal is fixed at the DClevel of the differential signal.

Thus, the second slicing level (b') output from the inverting circuit 31 and the first slicing level output from the dividing circuit 29 are symmetrical about the DC-level of the differential signal. The output signal of the inverting circuit 31 having the second slicing level (b') is supplied to an inverting terminal of an operational amplifier $OP_6$ which is the comparator 32.

The first lower limiter 28 has resistors R15–R19, a Zener diode $D_{z1}$, a diode D2 and an operational amplifier $OP_7$. The resistor R15 and the Zener diode $D_{z1}$ form a constant-voltage circuit. A noninverting terminal of the operational amplifier $OP_7$ is provided with a constant voltage from the constant-voltage circuit via the resistor R16. The operational amplifier $OP_7$ and the resistors R16–R19 form a noninverting amplifier circuit.

The resistor R15 is connected between a power line (e.g. 12 volts) and the cathode of the Zener diode $D_1$ having the anode connected to the ground line. Due to the reverse-current characteristic of the Zener diode $D_1$, the constant voltage (e.g., 2.0 volts) is generated between the Zener diode $D_{z1}$ and the resistor R15.

The noninverting terminal of the operational amplifier $OP_7$ is additionally provided with the output signal from the DC component detecting circuit 15 via the resistor R17. Thus, the noninverting terminal of the operational amplifier $OP_7$ is provided with a voltage level which is higher than the DClevel of the differential signal by the constant level. The voltage level is amplified by the noninverting amplifier circuit (including the operational amplifier $OP_7$) having an amplification factor depending on a rate of resistance values of the resistors R18 and R19. The output of the operational amplifier $OP_7$ is provided, via the diode D2, to a point at which the capacitor C7 of the peak-hold circuit 26 and the noninverting terminal of the operational amplifier $OP_2$ of the dividing circuit 29 are connected.

The anode of the diode D2 is connected to the output of the operational amplifier $OP_7$ and the cathode of the diode D2 is connected to a line connecting the capacitor C7 and the noninverting terminal of the operational amplifier $OP_2$. Thus, when the capacitor C7 is discharged so that the input level to the noninverting terminal of the operational amplifier $OP_2$ is less than the output level of the operational amplifier $OP_7$ of the first lower limiter 28, the diode D2 is turned on. A predetermined voltage (the output of the operational amplifier $OP_7$) is thus applied to the line between the capacitor C7 and the noninverting terminal of the operational amplifier $OP_2$. Thus, the lowest input level to the dividing circuit 29 is limited to the predetermined level by the first lower limiter 28.

The comparators 30 and 32 are formed of operational amplifiers $OP_5$ and $OP_6$ respectively. The differential signal from the differentiating circuit 21 is supplied to an inverting terminal of the operational amplifier $OP_5$ and a noninverting terminal of the operational amplifier $OP_6$. The signal having the first slicing level (b) is supplied from the dividing circuit 29 to the noninverting terminal of the operational amplifier $OP_5$. The signal having the second slicing level (b') is supplied from the inverting circuit 31 to an inverting terminal of the operational amplifier $OP_6$. When the level of the differential signal is greater than the first slicing level, the operational amplifier $OP_5$ outputs a signal having a low level. When the level of the differential signal is greater than the second slicing level, the operational amplifier $OP_6$ outputs a signal having a high level.

The second lower limiter 43 has resistors R24–R27, a diode D12 and an operational amplifier $OP_{14}$. The resistors R24–R27 and the operational amplifier $OP_{14}$ form an adder. The adder adds the DClevel detected by the DC component detecting circuit 25 and the level of the signal supplied from the DCamplifier 42 via the integrating circuit 44 and the clamping circuit 45. The output of the adder is applied via the diode D12 for reverse current prevention to the line between the capacitor C7 of the peak-hold circuit 26 and the noninverting terminal of the operational amplifier $OP_2$ of the dividing circuit 29. The output level of the adder is varied in accordance with a variation of the output of the clamping circuit 45 (corresponding to the level of the detected signal) and with a variation of the output of the DC component detecting circuit 25 (corresponding to the level of the differentiating signal).

A description will now be given, with reference to FIGS. 13A–13E, of operations of the binarizing circuit 41.

Figure 13D:
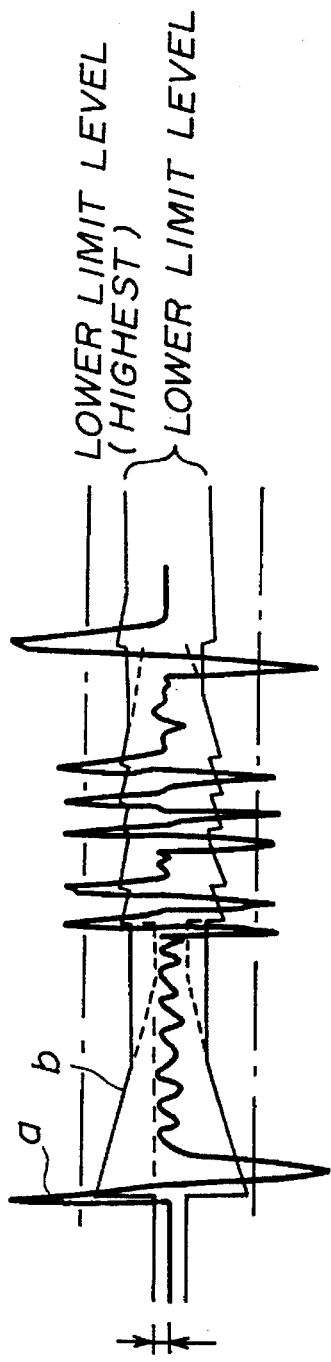
FIG. 13D is a waveform diagram illustrating a differential signal obtained by differentiating the signal shown in FIG. 13C.

When a label on which a bar code 11 is formed as shown in FIG. 13A is scanned by a laser beam, a detected signal which is varied in accordance with a variation of the amount of light projecting onto the detector 14, as shown in FIG. 13B, is obtained. The ACamplifier 20 amplifies the detected signal and outputs the signal as shown in FIG. 13C. The differentiating circuit 21 differentiates the signal from the ACamplifier 20 and outputs the differential signal (a) as shown in FIG. 13D.

The slicing levels are generated based on the differential signal (a) as shown in FIG. 13D. Each peak level of the differential signal (a) is held by the peak-hold circuit 26 and the peak-hold circuit 26 is then gradually discharged. As a result, the slicing level (b) output from the dividing circuit 29 is gradually decreased from a level which is half as large as each peak level of the differential signal (a) toward a greater one of the first and second lower limit levels, as shown in FIG. 13D.

Figure 13E:
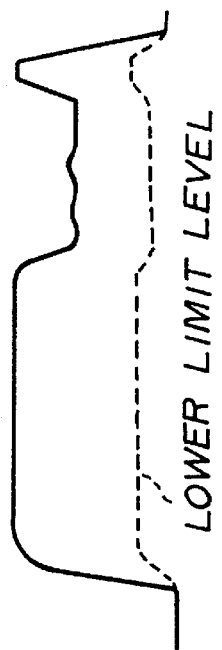
FIG. 13E is a diagram illustrating a DC component of the detected signal.

When the second lower limit is greater than the first lower limit, the lowest value of the slicing level (a) is limited to the second lower limit level. The DCamplifier 42 amplifies the detected signal as shown in FIG. 13B and the signal from the DCamplifier 42 is then integrated by the integrating circuit 44. The integrating circuit 44 outputs the signal as shown by a solid line in FIG. 13E. As a result, the second lower limit level as shown by a dotted line in FIG. 13E is obtained by the second lower limiter 43. When the DClevel Lo of the detected signal is large, the second lower limit level is large. Thus, even if noise levels are increased in accordance with increasing of the DClevel Lo of the detected signal, since the second lower limit level to which the lowest value of the slicing level (b) is limited is large, the noise levels are prevented from exceeding the slicing level (b). On the other hand, when the DClevel Lo of the detected signal is small, the second limit is small. Thus, even if the DClevel of the detected signal is decreased, signal components (the peak levels) of the differential signal (a) are prevented from being less than the slicing level (b). Thus, the detected signal can be accurately binarized.

In the binarizing circuit 41 having the above structure, the integrating circuit 44 which removes high-frequency components from the signal from the DCamplifier 42 is provided to prevent a large variation of the second lower limit level caused by noises.

In addition, in order to prevent the second lower limit level from increasing too much caused by external light other than the reflected light from the bar code, the clamping circuit 45 is provided. Even if the DClevel of the detected signal is increased too much caused by external light, since the level supplied to the second lower limiter 43 is limited, the second lower limit level (b) does not exceed a predetermined level as shown by a chain line in FIG. 13D.

Figure 14:
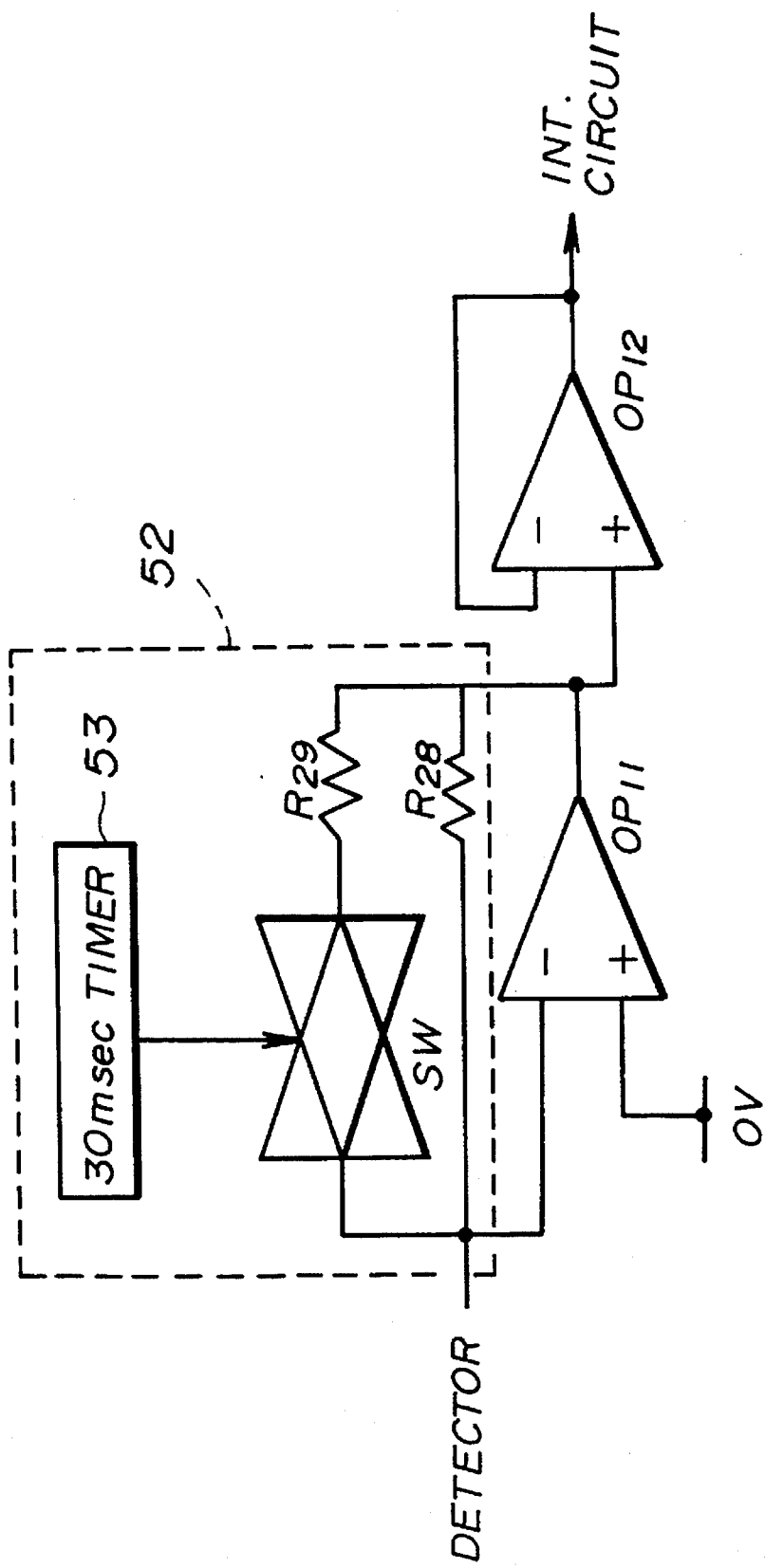
FIG. 14 is a circuit diagram illustrating a variation of the DCamplifier.

A description will now be given, with reference to FIG. 14, of a variation of the DCamplifier provided in the binarizing circuit 41. In FIG. 14, those parts which are the same as those shown in FIG. 9 are the same reference numbers.

Referring to FIG. 14, a DCamplifier 51 has the operational amplifiers $OP_{11}$ and $OP_{12}$ and a feedback resistor circuit 52. The feedback resistor circuit 52 has a timer 53, resistors R28 and R29 and a switching element SW such as an FET element. The resistor R28 is connected between the inverting input terminal of the operational amplifier $OP_{11}$ and the output terminal thereof. The switching element SW performs a switching operation based on a switching pulse signal from the timer 53 to select whether the resistor R29 is connected to the inverting input terminal of the operational amplifier $OP_{11}$ and the output terminal thereof. The state of the switching pulse signal output from the timer 53 is changed from a high level to a low level and vice versa at a predetermined intervals (e.g. 30 msec.). Thus, the value of the feedback resistor of the operational amplifier $OP_{11}$ is changed from a first value to a second value and vice versa at the predetermined intervals.

According to the DCamplifier 51 as described above, even if a reading condition of the bar code (e.g. a focusing condition, contrast between the white area and the black area and the like) is variously changed, the binarization of the detected signal can be accurately performed so that the bar code can be accurately read. For example, in a case where the bar code is located far from the reading window so that the scanning beam is not focused on the bar code, the dynamic range of the detected signal is reduced. In this case, when the DCamplifier 51 has a small amplification gain, the binarization process is performed. As a result, the second lower limit can be set between the noise level and the signal level.

Figure 15:
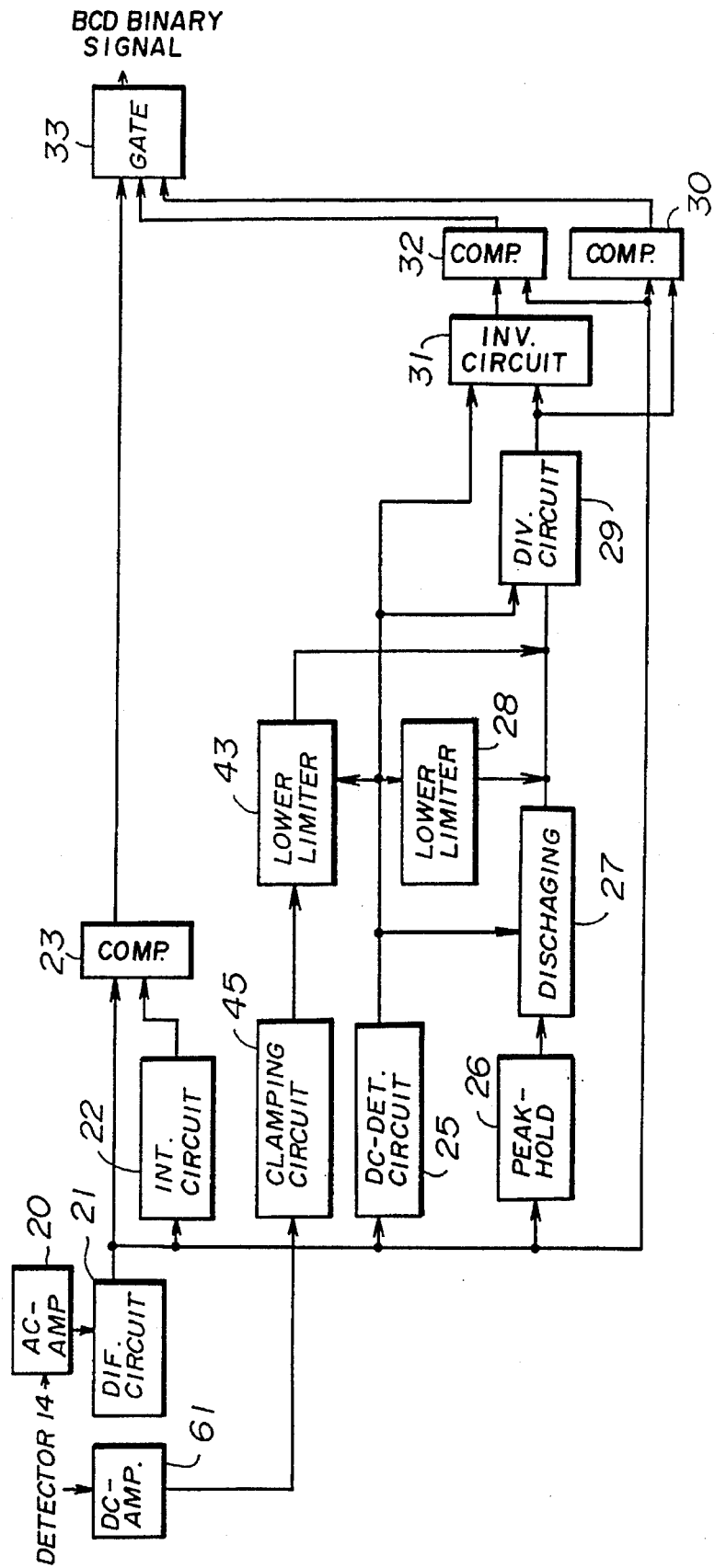
FIG. 15 is a block diagram illustrating a binarizing circuit according to a second embodiment of the present invention.

A description will now be given, with reference to FIG. 15, of a first variation of the binarizing circuit. In FIG. 15, those parts which are the same as those shown in FIG. 8 are given the same references.

Figure 16:
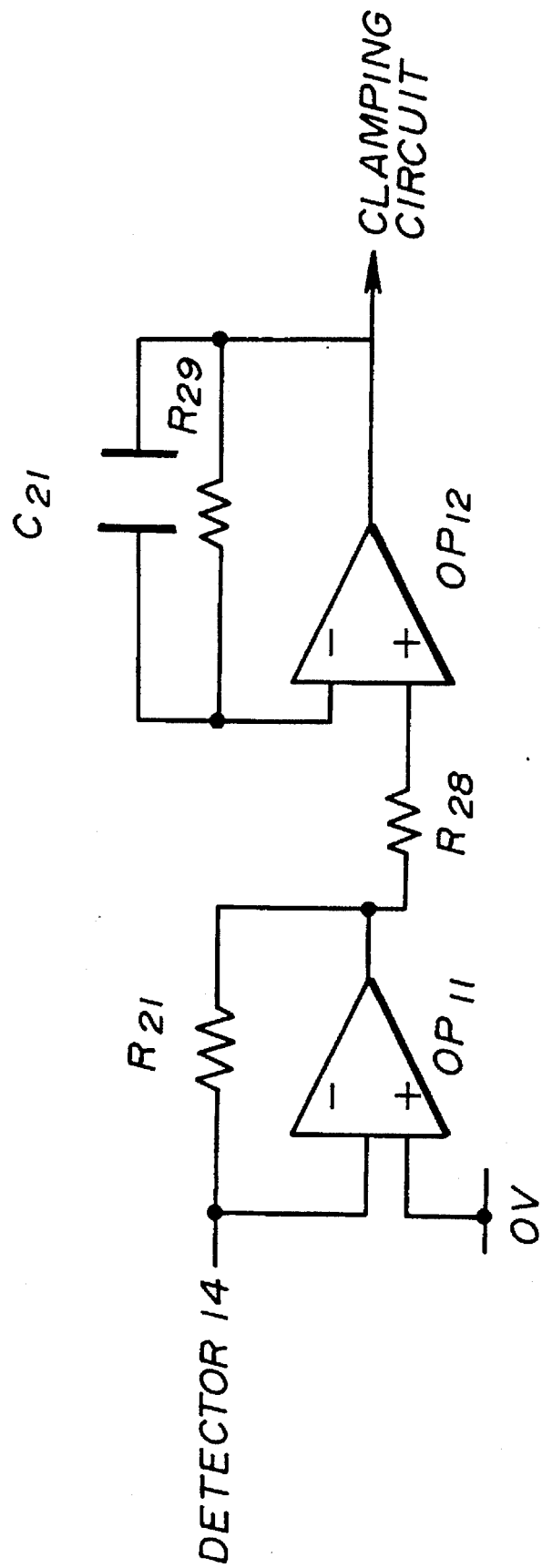
FIG. 16 is a circuit diagram illustrating a DCamplifier included in the binarizing circuit shown in FIG. 15.

In this variation shown in FIG. 15, the DCamplifier 61 has a function as the integrating circuit so that the high-frequency components are removed from the detected signal by the DCamplifier 61. The DCamplifier 61 in this variation is formed as shown in FIG. 16. Referring to FIG. 16, a resistor R29 and a capacitor C21 are connected to the operational amplifier $OP_{12}$ used as a buffer. A circuit including the operational amplifier $OP_{11}$ and the resistor R29 and the capacitor C21 has a function as the integrating circuit.

According to the first variation of the binarizing circuit, since the integrated circuit separated from the DCamplifier is not needed, the structure of the binarizing circuit is simplified.

Figure 17:
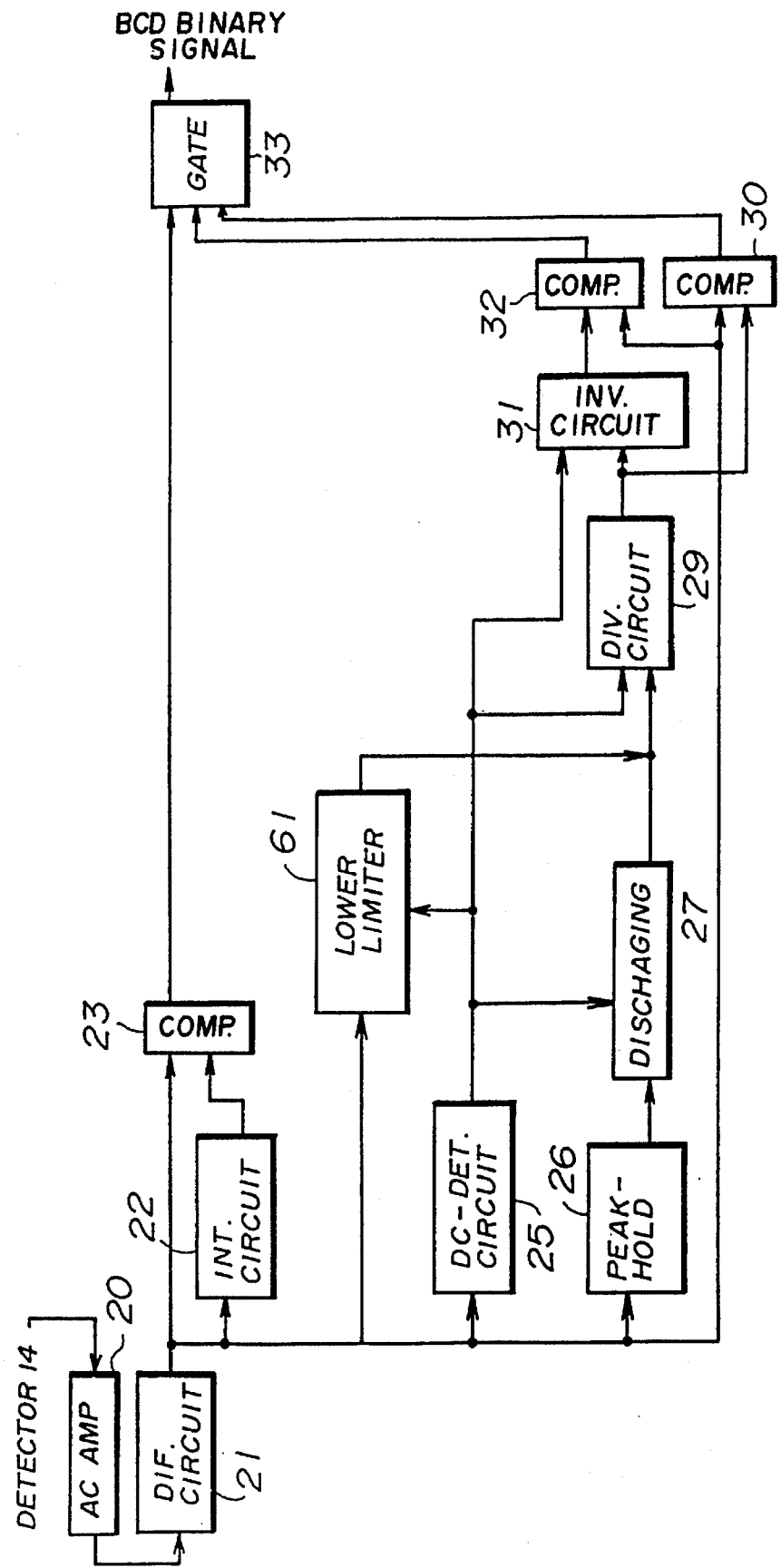
FIG. 17 is a block diagram illustrating a binarizing circuit according to a third embodiment of the present invention.

A description will now be given, with reference to FIG. 17, of a second variation of the binarizing circuit. In FIG. 17, those parts which are the same as those shown in FIG. 8 are given the same references.

In this variation shown in FIG. 17, a lower limiter 61 generates a lower limit level (corresponding to the second lower limit level described above) based on the differential signal supplied from the differentiating circuit 21. The concrete structure of parts, including the lower limiter 61, of the binarizing circuit shown in FIG. 17 is shown in FIG. 18. In FIG. 18, those parts which are the same as those shown in FIG. 12 are given the same reference numbers.

Referring to FIG. 18, the lower limiter 61 is formed of an operational amplifier, resistors and a diode D12. An input terminal of the lower limiter 61 is connected to the emitter of the transistor TR5 included in the input circuit to which the differential signal is supplied from the differentiating circuit 21. The lower limit level depending on the differential signal is applied from the operational amplifier, via the diode D12, to the line between the peak-hold circuit 26 and the dividing circuit 29.

A description will now be given, with reference to FIGS. 19A–19E, of operations of the binarizing circuit in the second variation.

Figure 19A:
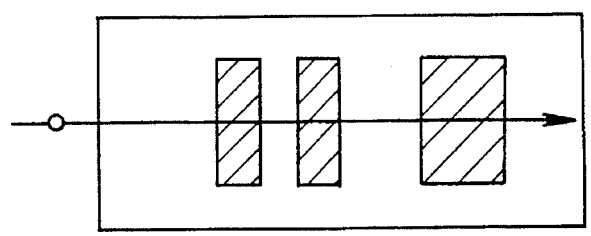
FIG. 19A is a diagram illustrating a label on which a bar code is formed.
Figure 19B:
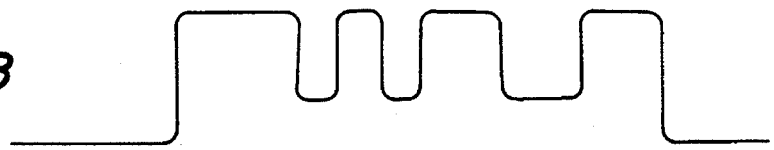
FIG. 19B is a waveform diagram illustrating a detected signal obtained when a scanning beam scans the surface of the label shown in FIG. 19A.
Figure 19C:
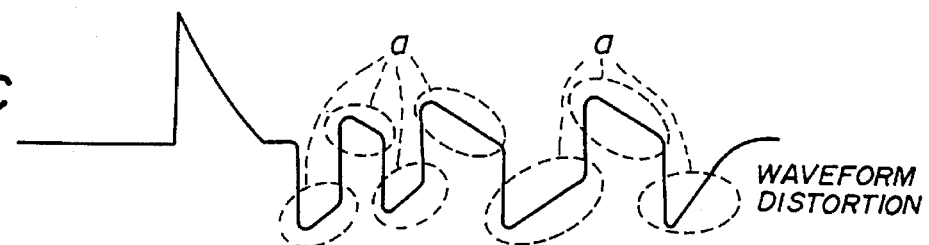
FIG. 19C is a detailed waveform diagram illustrating a signal obtained by AC-amplifying the detected signal shown in FIG. 19B.
Figure 19D:
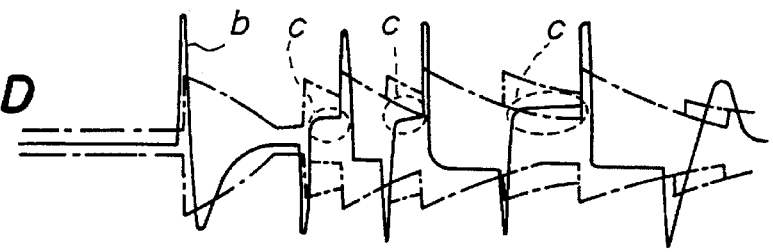
FIG. 19D is a waveform diagram illustrating a differential signal obtained by differentiating the signal shown in FIG. 19C and slicing levels.
Figure 19E:
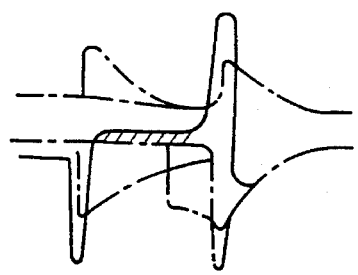
FIG. 19E is a detailed waveform diagram illustrating a part of the differential signal shown in FIG. 19D.

When a label on which a bar code is formed as shown in FIG. 19A is scanned by a scanning beam, a detected signal as shown in FIG. 19B is obtained by the detector 14. The detected signal is amplified by the ACamplifier 20 and the ACamplifier 20 outputs the signal as shown in FIG. 19C. Due to an output characteristic of the ACamplifier 20, the output signal of the ACamplifier is distorted so that ramp portions (a) having slight inclinations are generated as shown in FIG. 19C. The output signal of the ACamplifier 20 is differentiated by the differentiating circuit 21 and the differentiating circuit 21 outputs the differential signal (b) as shown in FIG. 19D. The differential signal (b) has portions (c) in each of which a level thereof rises caused by ramp portions (a) of the output signal of the ACamplifier 20. If the levels of these portions (c) of the differential signal (b) exceed the lower limit level, pulses corresponding to these portions appear in the binary signal. However, in this binarizing circuit, since the lower limit level is generated based on the differential signal, the lower limit level (b) rises in accordance with the rising of the level of the differential signal (b) as shown by chain lines in FIGS. 19D and 19E. Thus, the portions (c) of the differential signal (b) shown in FIG. 19D are prevented from exceeding the lower limit level (the slicing level). As a result, no pulses corresponding to the portions (c) of the differential signal (b) appear in the binary signal.

The present invention is not limited to the aforementioned embodiments, and other variations and modifications may be made without departing from the scope of the claimed invention.

What is claimed is:

1. A binarizing circuit comprising:

binary signal generating means for generating a binary signal from an input signal, supplied from an external unit, in accordance with a processing characteristic;

detecting means for detecting a state of the input signal; and control means for controlling, based on the state of the input signal detected by said detecting means, the processing characteristic in accordance with which said binary signal generating means generates the binary signal from the input signal, wherein said binary signal generating means generates the binary signal from the input signal in accordance with the processing characteristic by which noises are removed using a slicing level, the slicing level varying in accordance with the state of the input signal, a lowest level of the slicing level being limited to a lower limit level, and wherein said control means includes limit control means for controlling the lower limit level of the slicing level.

2. The binarizing circuit as claimed in claim 1, wherein said detecting means has DCcomponent detecting means for detecting a DClevel of the input signal, so that said control means controls the processing characteristic based on the DClevel of the input signal.

3. The binarizing circuit as claimed in claim 2, wherein said DCcomponent detecting means has DCamplifier means for DC-amplifying the input signal and means for removing high-frequency components from an output signal of said DCamplifier means.

4. The binarizing circuit as claimed in claim 1, wherein said limit control means has means for limiting a highest level of the lower limit level to a predetermined level.

5. The binarizing circuit as claimed in claim 1, wherein said detecting means has DClevel detecting means for detecting a DClevel of the input signal, so that said limit control means controls the lower limit level of the slicing level based on the DClevel of the input signal.

6. The binarizing circuit as claimed in claim 5, wherein said DClevel detecting means has means for switching an output DClevel to a plurality of levels, so that said limit control means controls the lower limit level of the slicing level based on a level which is selected as the output DClevel suitable for the state of the input signal from among the plurality of levels.

7. The binarizing circuit as claimed in claim 1, wherein said control means has means for generating a differential signal based on the input signal, so that said limit control means controls the lower limit level of the slicing level based on the differential signal.

8. A bar-code reader comprising:

reading means for optically reading an article on which a bar code is formed, said reading means outputting a detected signal corresponding to a reading result of the article;

a binarizing circuit for inputting the detected signal and outputting a binary signal corresponding to the detected signal; and decoding means for decoding the binary signal so that data represented by the bar code is obtained, wherein said binarizing circuit comprises:

binary signal generating means for generating the binary signal from the detected signal, supplied from said reading means, in accordance with a processing characteristic;

detecting means for detecting a state of the detected signal; and control means for controlling, based on the state of the detected signal detected by said detecting means, the processing characteristic in accordance with which said binary signal generating means generates the binary signal from the detected signal, wherein said binary signal generating means generates the binary signal from the detected signal in accordance with the processing characteristic by which noises are removed using a slicing level, the slicing level varying in accordance with a state of the detected signal, a lowest level of the slicing level being limited to a lower limit level, and wherein said control means includes limit control means for controlling the lower limit level of the slicing level.

9. The bar-code reader as claimed in claim 8, wherein said detecting means has DCcomponent detecting means for detecting a DClevel of the detected signal, so that said control mans controls the processing characteristic based on the DClevel of the detected signal.

10. The bar-code reader as claimed in claim 8, wherein said DCcomponent detecting means has DCamplifier means for DC-amplifying the detected signal and means for removing high-frequency components from an output signal of said DCamplifier means.

11. The bar-code reader as claimed in claim 8, wherein said limit control means has means for limiting a highest level of the lower limit level to a predetermined level.

12. The bar-code reader as claimed in claim 8, wherein said detecting means has DClevel detecting means for detecting a DClevel of the detected signal, so that said limit control mans controls the lower limit level of the slicing level based on the DClevel of the detected signal.

13. The bar-code reader as claimed in claim 12, wherein said DClevel detecting means has means for switching an output DClevel to a plurality of levels, so that said limit control means controls the lower limit level of the slicing level based on a level which is selected as the output DClevel suitable for the state of the detected signal from among the plurality of levels.

14. The bar-code reader as claimed in claim 8, wherein said control means has means for generating a differential signal based on the detected signal, so that said limit control means controls the lower limit level of the slicing level based on the differential signal.

* * * * *